US008471740B2

(12) United States Patent
Dinc et al.

(10) Patent No.: US 8,471,740 B2
(45) Date of Patent: Jun. 25, 2013

(54) REDUCING THE EFFECT OF NON-LINEAR KICK-BACK IN SWITCHED CAPACITOR NETWORKS

(75) Inventors: Huseyin Dinc, Greensboro, NC (US); Ahmed Mohamed Abdelatty Ali, Oak Ridge, NC (US); Paritosh Bhoraskar, Greensboro, NC (US)

(73) Assignee: Analog Devices, Inc., Norwood, MA (US)

( * ) Notice: Subject to any disclaimer, the term of this patent is extended or adjusted under 35 U.S.C. 154(b) by 27 days.

(21) Appl. No.: 13/314,451

(22) Filed: Dec. 8, 2011

(65) Prior Publication Data

US 2013/0120171 A1    May 16, 2013

Related U.S. Application Data

(60) Provisional application No. 61/559,345, filed on Nov. 14, 2011.

(51) Int. Cl.
*H03M 1/10* (2006.01)
(52) U.S. Cl.
USPC .......................................... 341/120; 341/118
(58) Field of Classification Search
USPC ................ 341/120, 131, 118, 155, 156, 121
See application file for complete search history.

(56) References Cited

U.S. PATENT DOCUMENTS

| 5,189,418 | A | 2/1993 | Bartz |
| 6,445,318 | B1 | 9/2002 | Ruha et al. |
| 6,473,019 | B1 | 10/2002 | Ruha et al. |
| 7,304,592 | B2 * | 12/2007 | Pinna et al. ................... 341/143 |
| 7,411,534 | B1 | 8/2008 | Melanson |
| 2002/0145550 | A1 | 10/2002 | Korkala |
| 2011/0037633 | A1 | 2/2011 | Kumamoto et al. |
| 2011/0210877 | A1 | 9/2011 | Ali et al. |

OTHER PUBLICATIONS

PCT International Search Report from PCT/US2012/054361 mailed on Dec. 3, 2012.
Sonkusale et al., "A/D and D/A Conversion Architectures and Techniques", Encyclopedia of RF and Microwave Engineering (2005).

* cited by examiner

*Primary Examiner* — Joseph Lauture
(74) *Attorney, Agent, or Firm* — Kenyon & Kenyon LLP

(57) ABSTRACT

A method and device involve a circuit having a switched capacitor network that is switchably connected to an input signal. A randomly determined amount of dither is injected into a circuit having a switched capacitor network that is switchably connected to an input signal. After injecting the dither, at least one correlation value is determined. The correlation value(s) indicates a degree of correlation between the injected dither and an output of the circuit. Distortion caused by an amount of charge kicked back into the circuit when the switched capacitor network is reconnected to the input signal may then be reduced. The reduction is calculated as a function of the correlation value(s).

24 Claims, 12 Drawing Sheets

REDUCING THE EFFECT OF NON-LINEAR KICK-BACK IN SWITCHED CAPACITOR NETWORKS

CROSS-REFERENCE TO RELATED APPLICATIONS

This application claims the benefit, under 35 U.S.C. §119 (e), of U.S. Provisional Patent Application No. 61/559,345, filed Nov. 14, 2011, the contents of which is hereby incorporated by reference in its entirety.

BACKGROUND INFORMATION

In a switched capacitor network, one or more capacitors are switched between different signals. In the context of an analog-to-digital converter (ADC), a set of capacitors may be charged by an input signal source during a sample phase, then switched to being connected to a reference voltage source during a hold (amplify) phase. When the capacitors are switched back to the input signal source during the next sample phase, residual charge stored on the capacitors can become superimposed onto the value of the input signal source in this sample phase. Part of this "kick-back" can be sampled by the input network at the end of this sampling phase, which can cause distortion of the sampled signal, memory effects and performance degradation. The kick-back is non-linear in that the amount of charge injected back into the ADC is not a linear function of the value of the input. Thus, it is not possible to correct for the kick-back using only the input value, e.g., by scaling the input value.

The problem of non-linear kick-back will now be explained in connection with FIGS. 1 to 3, which illustrate portions of a conventional ADC, in which an input voltage is compared to a set of reference voltages to generate a digital output. FIG. 1 shows a block diagram of a conventional multi-stage pipelined ADC. Three stages 100/110/120 are connected in succession so that the output of one stage may serve as the input of the next stage. For illustration purposes, only the first two stages and the final (Nth) stage are shown. However, any number of stages can be connected in this fashion. The first stage 100 is connected to an analog input voltage Vin and includes an ADC 10 (also known as a "flash") and a multiplying digital-to-analog converter (MDAC) 50. The MDAC 50 includes a digital-to-analog converter (DAC) 20 and an amplifier 30. Vin is input to the ADC 10 to generate a digital input to the DAC 20, which in turn converts the digital output of the ADC 10 back into an analog signal. The analog output of the DAC 20 is then subtracted from Vin and the result input to the amplifier 30 to generate an analog output voltage Vo as input to the next stage, i.e., stage 110. The stages 100/110/120 may include similar components, with the analog output of one stage going into the input of the next stage in order to perform an analog-to-digital conversion of Vin. However, the final stage, i.e., stage 120, may not include a DAC or amplifier since the final output of the ADC is a digital signal that can be generated, for example, directly from the output of the ADC 10.

FIG. 2 shows a block diagram of the ADC 10. Vin is compared in parallel, by a set of comparators 12, to a respective set of reference voltages having values ranging between $7/16*VFS$ and $-7/16*VFS$, where VFS is the full-scale voltage of the stage 100. The output of each comparator 12 forms an individual bit of a digital output signal FL of the ADC 10, for a total of eight bits FL0 to FL7, which collectively form a thermometric code. However, the number of bits output may vary in other embodiments. In one example, when Vin is at a value V1, FL is 0 0 0 0 1 1 1 1, with the left-most bit being the most significant, i.e., corresponding to FL7 in FIG. 2. Continuing the example, when Vin is at a value V2, FL is 0 0 1 1 1 1 1 1.

FIG. 3 shows a schematic diagram of the stage 100. Although shown as a single line in FIG. 1, Vin may actually be input to the ADC 10 as a differential input in the form of a pair of complementary voltages Vin+/Vin− that have equal magnitude, but opposite polarity. Vin+ and Vin− are switchably connected to a respective set of eight capacitors 8C in parallel (the actual number of such capacitors may vary across different implementations, and even between different stages). The capacitors 8C are also switchably connected to Vref+ and Vref−, which are positive and negative reference voltages of equal magnitude and opposite polarity, around a reference common-mode level. The stage 100 operates as follows: During the sample phase, Vin+ and Vin− are connected to first terminals of all eight of their respective capacitors 8C, the amplifier 30 is reset and second terminals of the capacitors 8C are shorted together to a common mode voltage VCM. During a hold phase, Vin+ and Vin− are disconnected from the capacitors 8C, the amplifier is enabled and, as explained below, the capacitors 8C are selectively connected to Vref+ and Vref− based on the sampled values of Vin+ and Vin−.

The DAC 20 may convert the digital output of the ADC 10 into an analog signal by selectively connecting the capacitors 8C in response to the ADC 10 output. At the same time, the connection of the capacitors 8C may also be selected to reflect the subtraction of the DAC output from Vin, shown symbolically in FIG. 1 as a summation node 17. In one example, when Vin has a value of V1 (i.e., Vin+ minus Vin− equals V1 for differential implementation), four capacitors in each set of eight capacitors 8C may be connected to Vref+ and four capacitors connected to Vref−. On the other hand, when Vin has a value of V2, six capacitors in the set 8C associated with Vin+ may be connected to Vref+ and two capacitors connected to Vref−. Correspondingly, when Vin equals V2, six capacitors in the set 8C associated with Vin− may be connected to Vref− and two capacitors connected to Vref+. From this example, it can be seen that when Vin equals V1, zero charge is dumped back into the input when the capacitors 8C are reconnected to Vin+ and Vin− during the next sample phase, since the contributions of the capacitors cancel out. However, when Vin equals V2, a net charge of 6C*Vref− 2C*Vref, i.e., 4C*Vref, is dumped back into the input (i.e., kick-back).

Depending on the sampling frequency and input source characteristics, the input source cannot always absorb the kick-back charge completely. If the disturbance is not fully absorbed by the time the next sample is taken, it distorts Vin by transferring residual charge back into the ADC. As previously explained in connection with the operation of the DAC 20, the amount of this residual charge depends on the ADC 10 output, i.e., the quantized value of the previous input by ADC 10.

One known method of reducing kick-back is to short the capacitors 8C together using a switch, in order to discharge as much charge as possible before reconnecting the capacitors back to the input. A disadvantage to this method is that it reduces the time available for connecting to Vin, so that it becomes more difficult to acquire the input. Additionally, the timing of the control signal required to control the switch that shorts the sample capacitors (capacitors 8C) before connecting them back to the input is difficult to control accurately.

Another known method of reducing kick-back is to use a separate set of capacitances for sampling the input from those used for the DAC, e.g., a set of dedicated DAC capacitors would be provided in addition to the sample capacitors (capacitors 8C). However, this degrades the feedback factor of the MDAC amplifier and causes signal-to-noise ratio (SNR) degradation.

SUMMARY

Example embodiments of the present invention provide for a reduction in distortion caused by an amount of charge kicked back into a circuit having a switched capacitor network that is switchably connected to an input signal.

An example embodiment of the present invention is directed to a method that includes the steps of injecting a randomly determined amount of dither into a circuit having a switched capacitor network that is switchably connected to an input signal, and after injecting the dither, and during a time period in which the switched capacitor network is disconnected from the input signal, determining at least one correlation value indicating a degree of correlation between the injected dither and an output of the circuit. The method further includes reducing distortion caused by an amount of charge kicked back into the circuit when the switched capacitor network is reconnected to the input signal. An amount of the reduction is calculated as a function of the at least one correlation value.

An example embodiment of the present invention is directed to a device that includes a hardware arrangement, a correlation circuit and a correction circuit. The hardware arrangement injects a randomly determined amount of dither into a first circuit having a switched capacitor network that is switchably connected to an input signal. The correlation circuit, after injecting the dither, and during a time period in which the switched capacitor network is disconnected from the input signal, determines at least one correlation value indicating a degree of correlation between the injected dither and an output of the first circuit. The correction circuit reduces distortion caused by an amount of charge kicked back into the circuit when the switched capacitor network is reconnected to the input signal. An amount of the reduction is calculated as a function of the at least one correlation value.

DETAILED DESCRIPTION OF EXAMPLE EMBODIMENTS

System Overview

Figure 1:
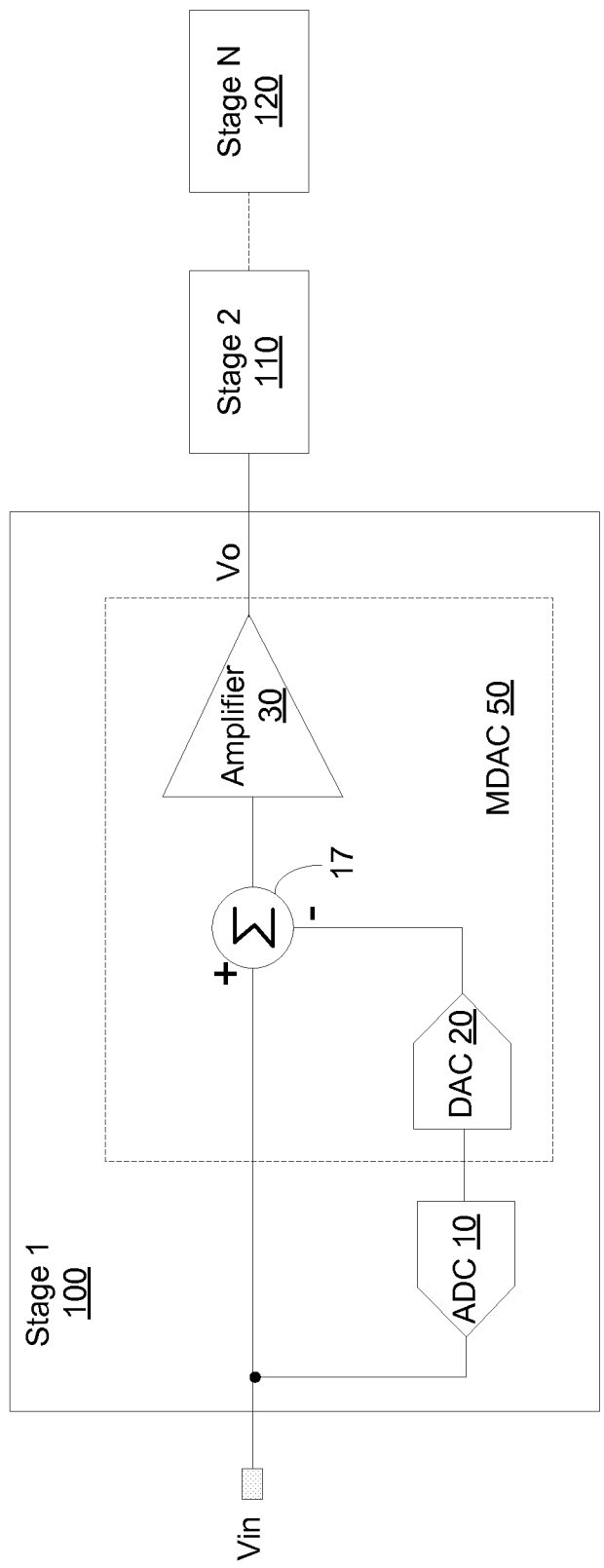
FIG. 1 shows a block diagram of a conventional pipelined ADC.
Figure 2:
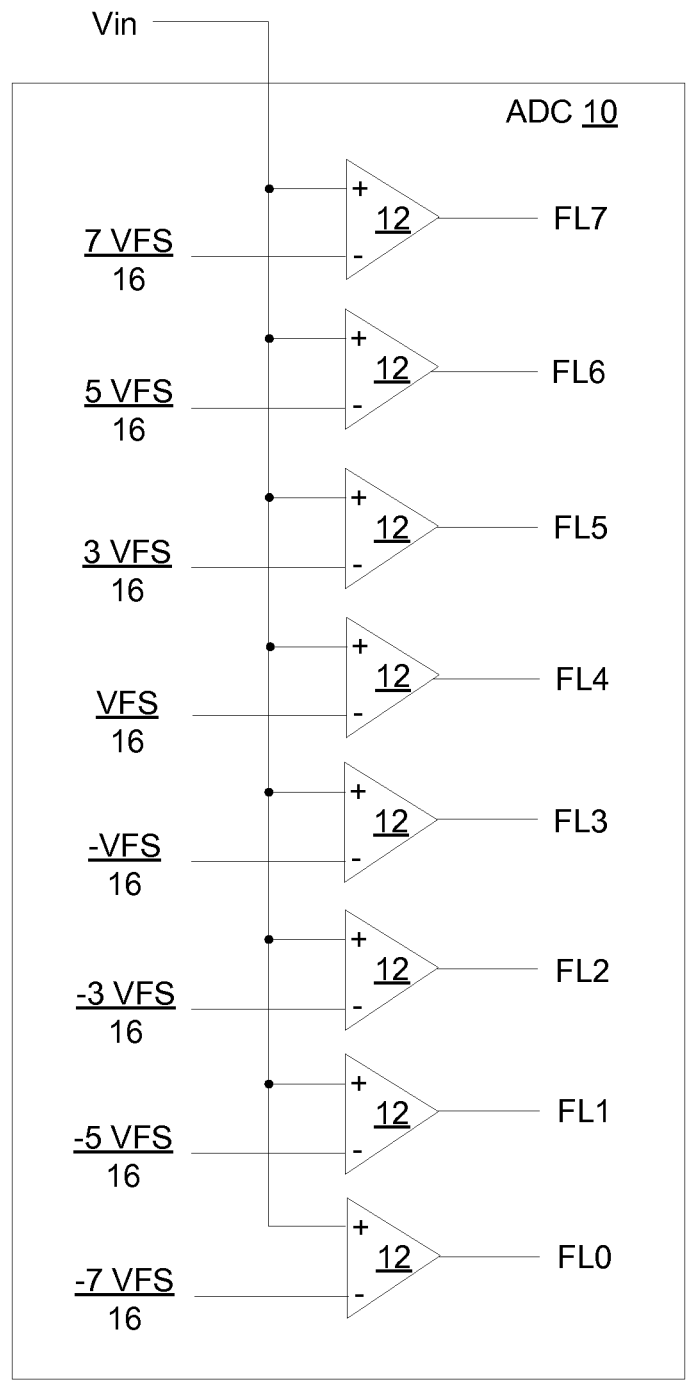
FIG. 2 shows a block diagram of an ADC component (flash) of the ADC in FIG. 1.
Figure 3:
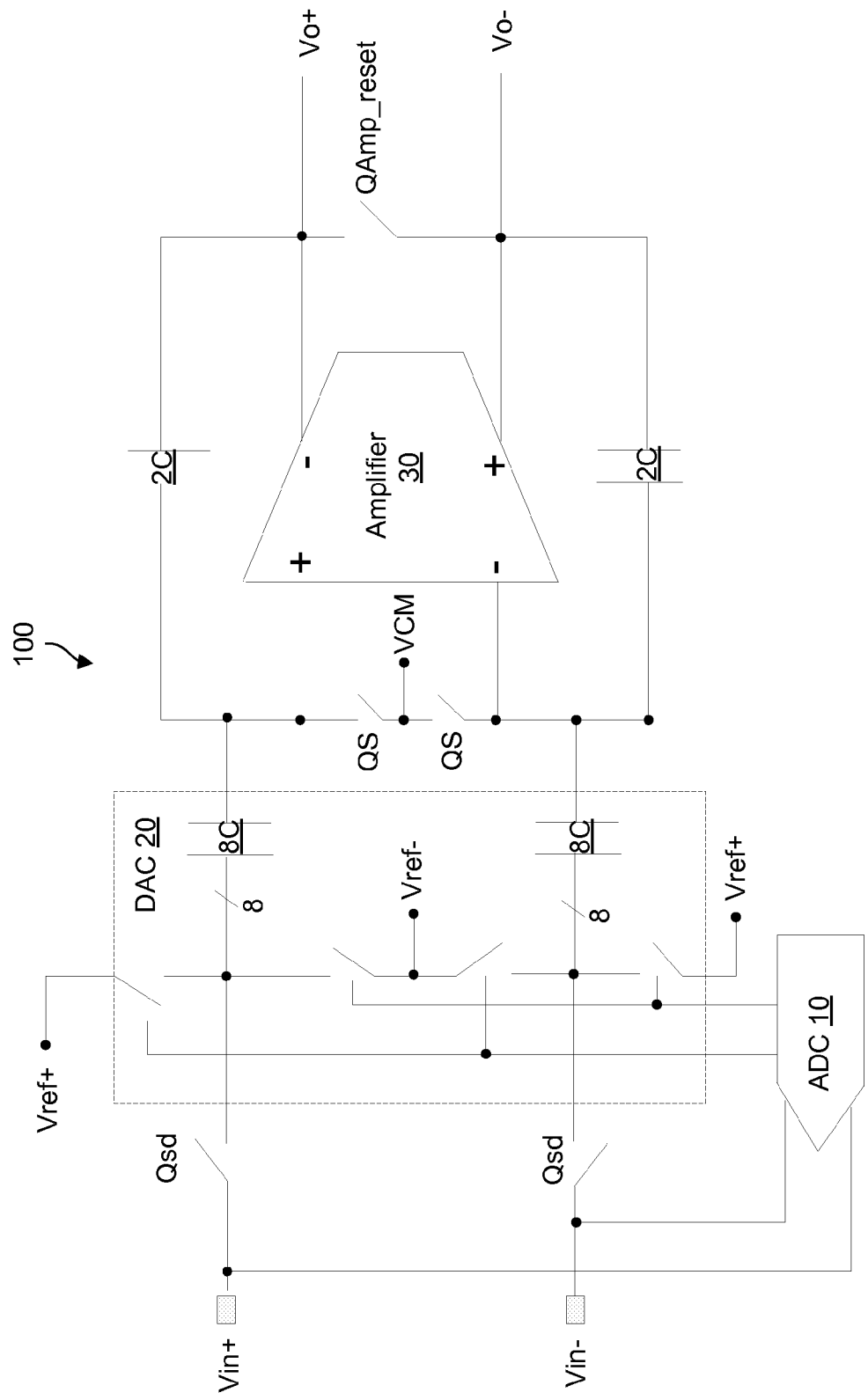
FIG. 3 shows a schematic diagram of a first stage of the ADC in FIG. 1.
Figure 4:
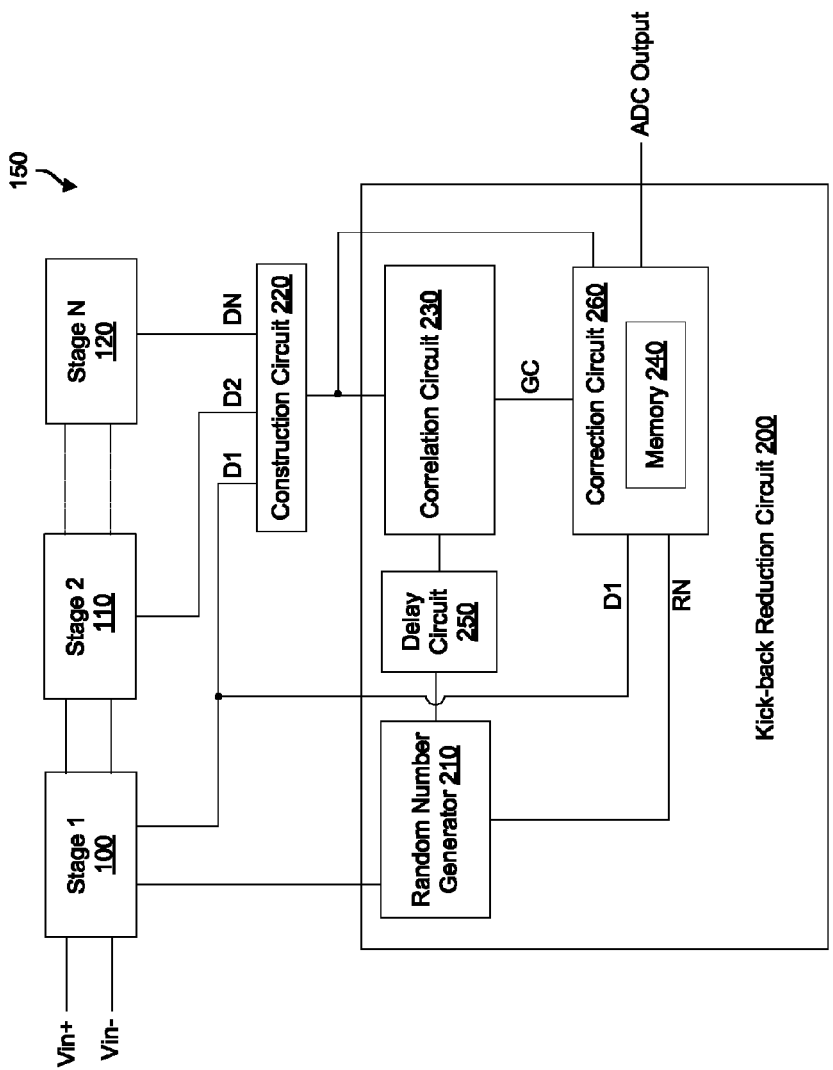
FIG. 4 shows an exemplary system for kick-back reduction according to the present invention.

The present invention relates to systems and methods for kick-back and memory reduction in switched capacitor networks. FIG. 4 shows an exemplary system 150 according to the present invention. The system 150 may include the stages 100/110/120 as described above in connection with FIGS. 1 to 3, in addition to a kick-back reduction circuit 200. The circuit 200 may include a random number generator 210, a correlation circuit 230, a memory 240, a delay circuit 250 and a correction circuit 260. The system 150 may further include a construction circuit 220.

The random number generator 210 outputs a random number RN, which may be a digital number generated using, for example, a pseudo-random algorithm.

The construction circuit 220 is configured to combine digital signals (D1/D2/DN) from each of the stages to form a combined digital signal representing a digitized version of Vin. D1/D2/D3 may be generated by encoding the FL output of the ADC 10, which is a thermometric code, into any binary code. The operation and implementation of the construction circuit 220 may be similar to that of conventional construction circuits used in pipelined ADCs, and will not be discussed in further detail.

The correlation circuit 230 is configured to receive the combined digital signal from the construction circuit 220 and to correlate the random number RN to the overall ADC output, i.e., the output of the construction circuit 220. Thus, the correlation circuit 230 may receive RN as an additional input. The correlation may be performed using any statistical correlation technique. In one embodiment, the correlation technique used is least mean squares (LMS). Applying an LMS algorithm, the correlation circuit 230 may determine a gain coefficient GC indicative of a level of correlation between RN and the ADC output. GC is then output to the correction circuit 260.

The delay circuit 250 may include delay elements, e.g., buffer stages, for delaying the transmission of RN to the correlation circuit 230 in order to allow sufficient time for the construction circuit 220 to generate the combined digital signal.

In an alternative embodiment, the correlation circuit 230 may correlate RN to the combined digital output of Stages M to N, where M is any integer from 2 to N. Although it may be preferable to use the overall ADC output because it is the most accurate representation of Vin (i.e., the input to the first stage 100)—and therefore most accurately represents the kick-back, it is also possible to accurately calculate GC without combining the digital signals from all the stages, i.e., using only Stages M to N.

The correction circuit 260 may include circuitry for modifying the ADC output (output of the construction circuit 220) to reduce kick-back. In one embodiment, the correction circuit 260 may generate two correction values as a function of RN, GC and the ADC 10 output of the first stage 100 (i.e., D1), then apply the correction value to the output of the construction circuit 220. For example, the correction circuit 260 may be implemented as a digital subtractor that subtracts the correction values from the combined digital signal generated by the construction circuit 220, thereby generating the final (corrected) output of the ADC. The first correction value corresponds to the kickback caused by injecting the dither (connecting the calibration capacitors CCal 50/55 to the input based on RN). The second correction value corresponds to the kickback caused by the input signal from the previous sample.

The correction circuit 260 may include the memory 240 for storing the random number RN together with a corresponding GC value in the memory 240. In one embodiment, the memory 240 only stores a single RN-GC pair corresponding to the most recent random number and gain coefficient. However, any number of RN-GC pairs may be stored to remove kick-back errors prior to the previous input sample and RN.

Figure 5A:
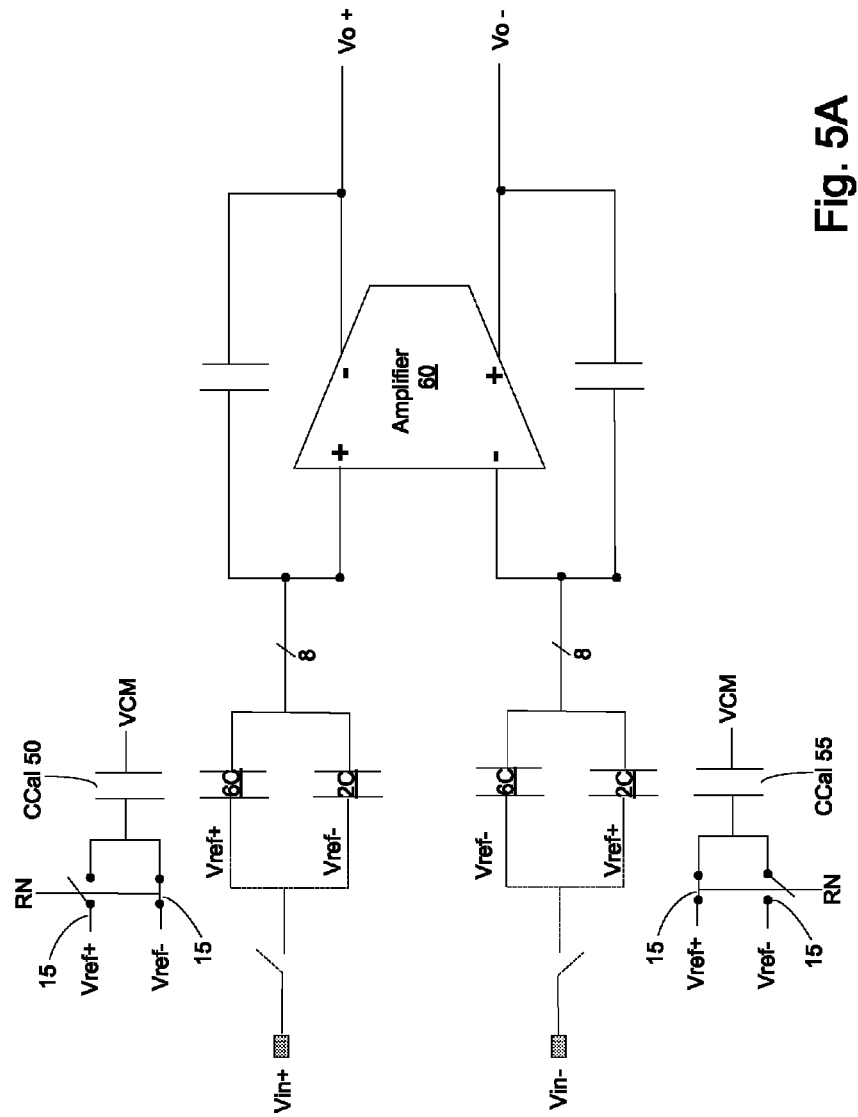
FIG. 5A shows a first circuit configuration of an exemplary kick-back reduction arrangement using dither injection into a DAC in FIG. 1.

FIG. 5A shows a first circuit configuration of an exemplary kick-back reduction arrangement, implemented in the stage 100 of the system 150 during a hold phase. Referring back to the example where Vin equals V2 and the output of the ADC 10 is 0 0 1 1 1 1 1 1, six capacitors 6C associated with Vin+ are connected to Vref+ and two capacitors 2C associated with Vin+ are connected to Vref−. Simultaneously, six capacitors 6C associated with Vin− are connected to Vref− and two capacitors 2C associated with Vin− are connected to Vref+. A random number RN generated by the generator 210 determines whether to connect a first terminal of a first capacitor CCal 50 to Vref+ or Vref−. For example, RN may be a 1-bit number and CCal 50 is connected to Vref+ when RN equals 1 and to Vref− when RN equals 0. The number of bits in RN may vary across implementations. A second terminal of the capacitor CCal 50 may be connected to the common mode voltage VCM. The capacitor CCal 50 is associated with Vin+. A complementary structure may be provided for Vin−, including a second capacitor CCal 55 connected to Vref+ and Vref− in opposing dependence on RN. That is, when CCal 50 is connected to Vref−, CCal 55 is connected to Vref+ and vice versa.

Figure 5B:
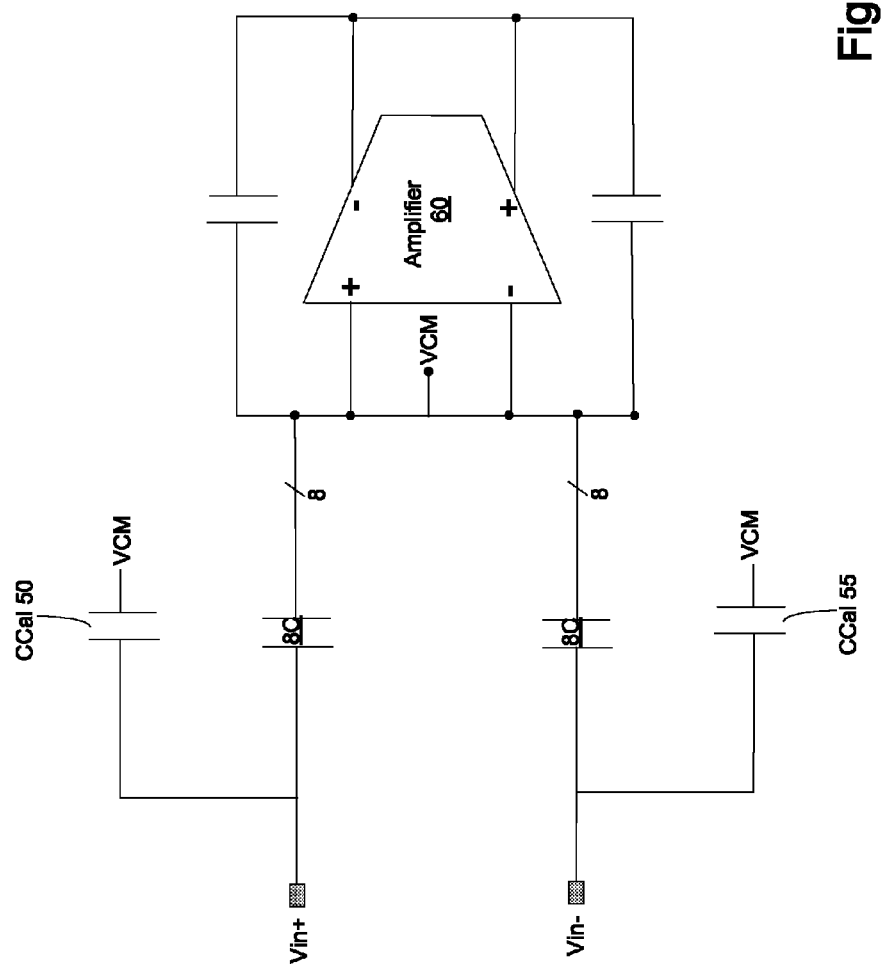
FIG. 5B shows a second circuit configuration of the kick-back reduction arrangement of FIG. 5A.

FIG. 5B shows the arrangement of FIG. 5A during a sample phase. As was the case with the conventional ADC of FIG. 3, Vin+ and Vin− are connected to first terminals of their respective sets of capacitors 8C with second terminals of the capacitors 8C connected to VCM and the amplifier 60 is in a reset (i.e., output-disabled) state. Additionally, Vin+ and Vin− are connected to first terminals of CCal 50 and CCal 55, respectively, so that the charge previously stored on each capacitor 50/55 (i.e., +/−Vref*CCal) is applied to Vin+ and Vin−. In this manner, a random noise signal, known as dither, is applied to the DAC 20 of Stage 1. This dither creates a kick-back in a similar way to the kick-back contributed by the remaining capacitors 8C. Since the gain of the dither is indicative of a transfer function of the kick-back, which in turn indicates a kick-back of the capacitors 8C, the kick-back contributed by the capacitors 8C may be determined on a sample-by-sample basis as a function of the gain coefficient of the dither and the ADC 10 output, which is represented by D1 in FIG. 4.

Figure 6A:
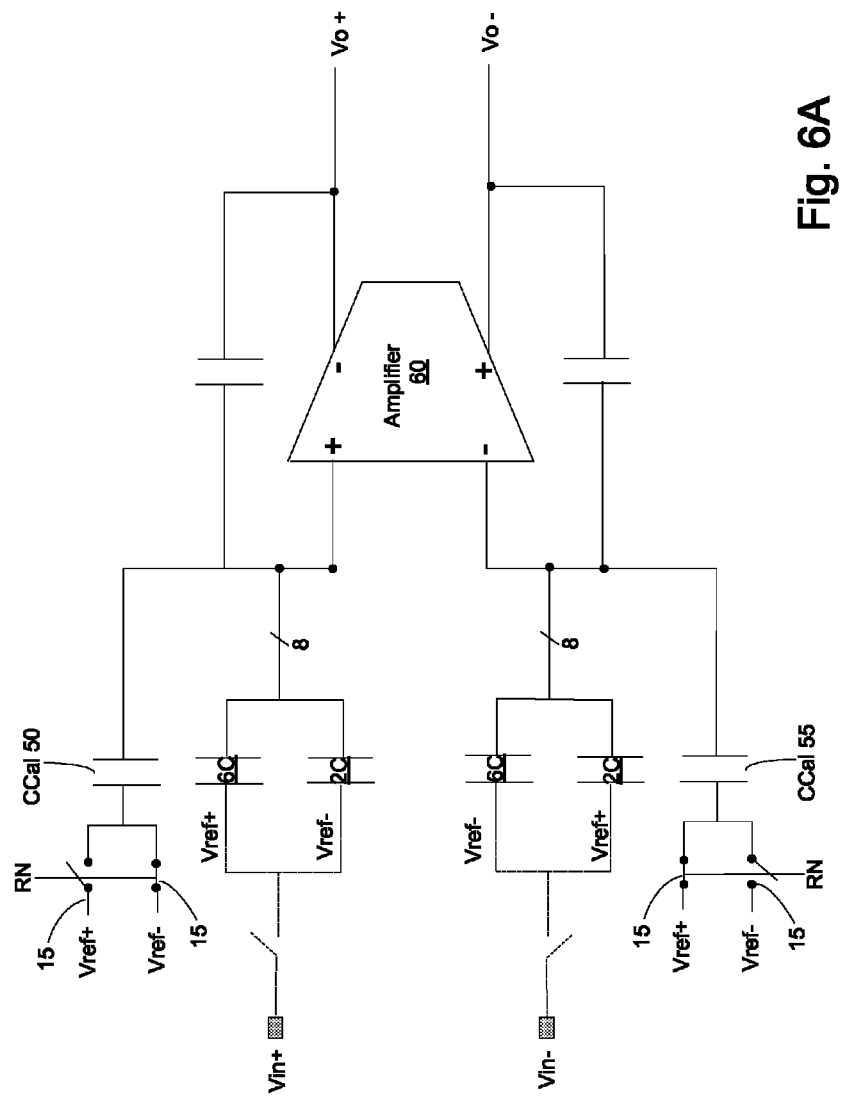
FIG. 6A shows a first circuit configuration of another exemplary kick-back reduction arrangement using dither injection into the DAC of FIG. 1.

FIG. 6A shows an alternative circuit configuration of an exemplary kick-back reduction arrangement, implemented in the stage 100 of the system 150 during a hold phase. The arrangement of FIG. 6A is similar to that of FIG. 5A, except that the second terminals of CCal 50/55 are connected to respective inputs of the amplifier 60 instead of VCM. CCal 50/55 are charged to Vref+ or Vref− as before.

Figure 6B:
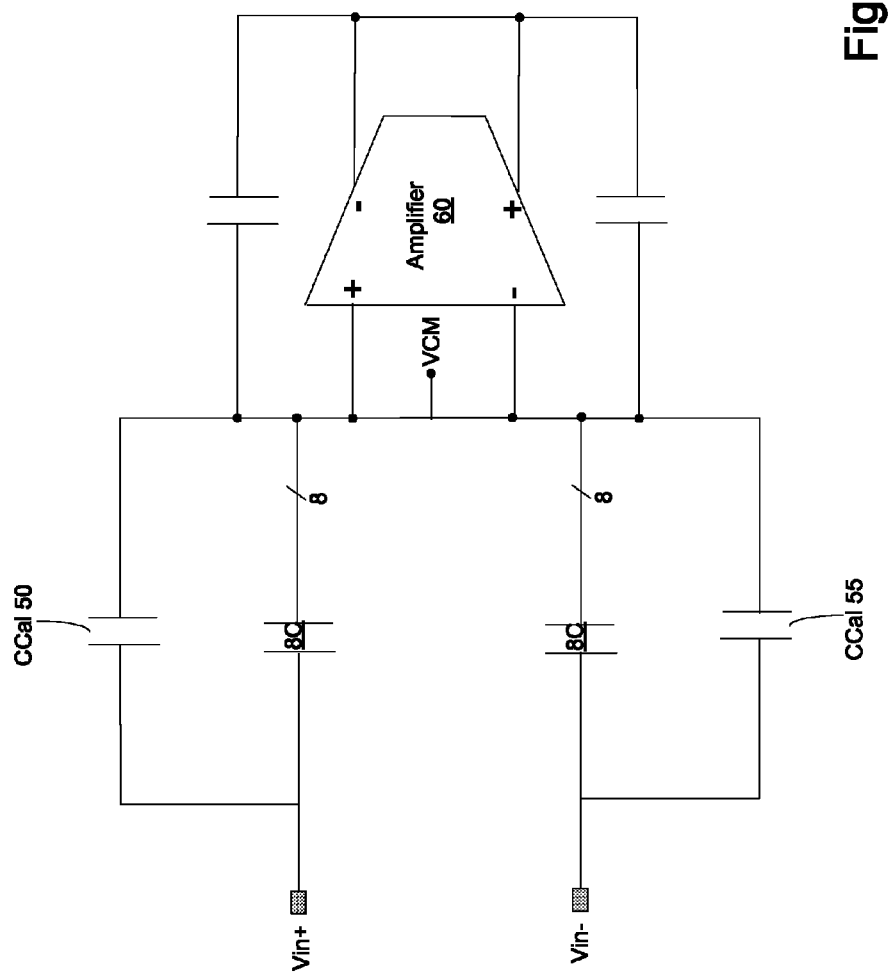
FIG. 6B shows a second circuit configuration of the kick-back reduction arrangement of FIG. 6A.

FIG. 6B shows the arrangement of FIG. 6A during a sample phase. As with the arrangement of FIG. 5B, the charges stored on CCal 50/55 are applied to Vin. The inputs of the amplifier 60 are also shorted to VCM during this time.

Kick-Back Correction with Dither Injection into the DAC

Exemplary methods for kick-back reduction will now be described with reference to the example systems and devices previously discussed. However, the methods may also be implemented in other systems and devices and may, for example, be applied to circuits having a switched capacitor network.

Figure 7:
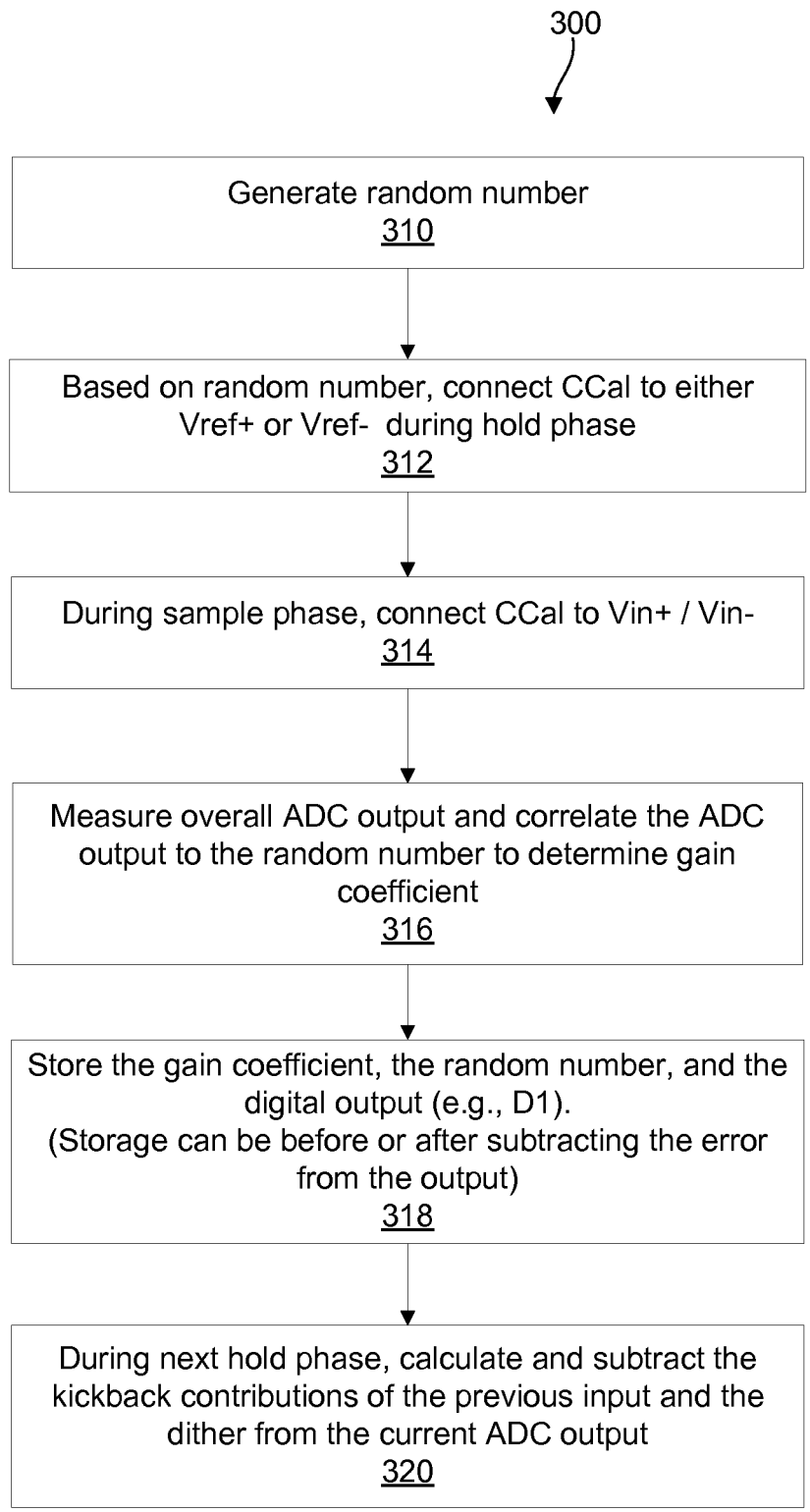
FIG. 7 shows an exemplary method for kick-back reduction using dither injection into the DAC of FIG. 1.

FIG. 7 shows an exemplary method 300 for kick-back reduction, in which the dither is applied to the DAC 20. In step 310, the random number RN is generated by the generator 210.

In step 312, the capacitors CCal 50/55 are connected to either Vref+ or Vref− during the hold phase.

In step 314, the sample phase is entered into and thus CCal 50/55 are disconnected from the reference voltages and instead connected to Vin+ and Vin−, respectively.

In step 316, the overall ADC output is obtained from the construction circuit 220 and input to the correlation circuit 260 to correlate the ADC output to the random number RN from the previous sample. Using an LMS algorithm to perform the correlation, the correlation circuit 260 generates the gain coefficient GC. For example, the correlation may occur as follows:

$$GC_{n+1}(k,k-1)=GC_n(k,k-1)-\mu * Vd_{k-1} * [Vd_{k-1} * GC_n(k,k-1)-Vin_k] \quad (1)$$

where GC(k, k−1) is the gain coefficient corresponding to the kick-back contributed by sample k−1 (i.e., the previous sample) onto sample k (i.e., the current sample), µ is an LMS step-size constant, $Vd_{k-1}$ is equal to the dither applied during the previous sample (e.g., $RN_{k-1}$), and $Vin_k$ is the current digital output of the ADC (i.e., the output of the construction circuit 220 that results from the sample in step 314). The initial value of GC may be set to zero or, alternatively, to a predetermined minimum value.

In equation (1) above, n may differ from k depending on how often GC is updated. For example, if GC is calculated once per sample, then n is always equal to k (assuming n and k start from the same initial value, e.g., zero). However, if GC is updated at a different rate than the sampling rate, then n and k will differ.

In step 318, the gain coefficient GC and the random number RN are stored in the memory 230 for use in correcting the next sample. It should be noted that the LMS algorithm can be applied to samples that are older than the immediately preceding sample. This may be beneficial when the sampling rate of the stage 100 is high. In such instances, kick-back may result from cumulative contributions of different samples. Accordingly, the memory 230 may be configured to store a plurality of GC-RN pairs and the digital output (e.g., D1), each corresponding to a different sample. Correlation using older samples may occur as follows:

$$GC_{n+1}(k,k-a)=GC_n(k,k-a)-\mu * Vd_{k-a} * [Vd_{k-a} * GC_n-Vin_k] \quad (2)$$

where GC(k, k−a) is the gain coefficient corresponding to the kick-back contributed by sample k−a onto sample k, and $Vd_{k-a}$ is the dither applied "a" samples ago.

Over time, the gain coefficient GC tends to converge to a substantially constant value. Therefore, one alternative to the equation (2) above is to extrapolate GCs for older memory effects from GCs corresponding to more recent memory effects, by assuming that the ADC and the input source to the ADC respond linearly to the input and the kick introduced by the calibration. For example, assuming an over-damped input network, using the calculated values for GC(k,k−1) and GC(k, k−2), the value for GC(k,k−3) can be extrapolated. Correction may then be performed using the extrapolated GC(k,k−3) together with stored values of $D1_{k-3}$ and $RN_{k-3}$.

In step 320, kick-back contributions resulting from the dither as well as the previous input are calculated. The contributions are subtracted from the current ADC output. If dither is injected using the arrangement of FIGS. 5A and 5B, then the following equations apply:

$$KB1=RN_{k-1}*GC_n(k,k-1)$$

$$KB2=GC_n(k,k-1)*8C/CCal*D1_{k-1}$$

where KB1 is the contribution of the previously injected dither onto the current ADC output, KB2 is the contribution of the previous sample onto the current ADC output, $RN_{k-1}$ is the random number used in the previous sample, $GC_n(k,k-1)$ is the gain coefficient calculated based on the previous sample, and $D1_{k-1}$ is the digital data corresponding to the digitized value of Vin, generated by the ADC 10 in stage 100 from the previous sample. KB1 and KB2 may be subtracted from the entire ADC output (the output of the construction circuit 220) by the correction circuit 240. Specifically, the output of the construction circuit 220 equals the digital value of the input signal (Vin), plus KB1 and KB2. Thus, if KB1 and are subtracted, the digital value of Vin can be obtained as the final ADC output. In this manner, the kick-back due to charge dumped into the input network by the capacitors 50/55/8C are removed in the digital domain.

The calculation of the kickback contributions from the input and the dither will vary depending on how the dither injection is implemented. For example, if dither is injected using the arrangement of FIGS. 6A and 6B, the following equations apply:

$$Vd=RN_k*CCal/8C*Vref$$

$$KB1=GC_n(k,k-1)*RN_{k-1}*Vref$$

$$KB2=GC_n(k,k-1)*D1_{k-1}*8C/CCal*Vref$$

In this instance, the final ADC output can be obtained by subtracting, Vd, KB1 and KB2 from the construction circuit 220 output. Vd appears as an additional term because in the hold phase the second terminal of CCal 50 and 55 are connected to the inputs of the amplifier 60.

In an alternative embodiment, GCs may be calculated based on a non-linear response. In practice, it may be the case that the amount of charge sampled back in the next sample phase may depend on the magnitude of the kick-back and/or the input signal in a nonlinear fashion. With proper modifications the kick-back correction can be done to compensate for this nonlinear dependence. For example, instead of calculating a single GC value, for each relevant time period (e.g., each injection), a plurality of GC values may be calculated, each corresponding to a coefficient of non-linearity (e.g., $GC_n$, $GC2_n$, $GC3_n$, etc., where $GC_n$ is the coefficient of the linear response, $GC2_n$ is the coefficient of the second order nonlinearity, $GC3_n$ is the coefficient of the 3rd order nonlinearity etc.). Thus, the plurality of GCs may form a set that includes a first order (linear) gain coefficient and at least one higher order (non-linear) gain coefficient (e.g. $GC3_n$).

Kick-Back Correction with Dither Injection into the Flash

In the example system and methods described above, kick-back correction was performed by injecting dither into the DAC, e.g., by using calibration capacitors CCal that are selectively connected to Vref+ and Vref− based on the random number RN. In the alternative embodiments described below, it is possible to inject dither elsewhere in the ADC, such as into the flash (e.g., into the input of the ADC 10) in the first stage 100.

Figure 8:
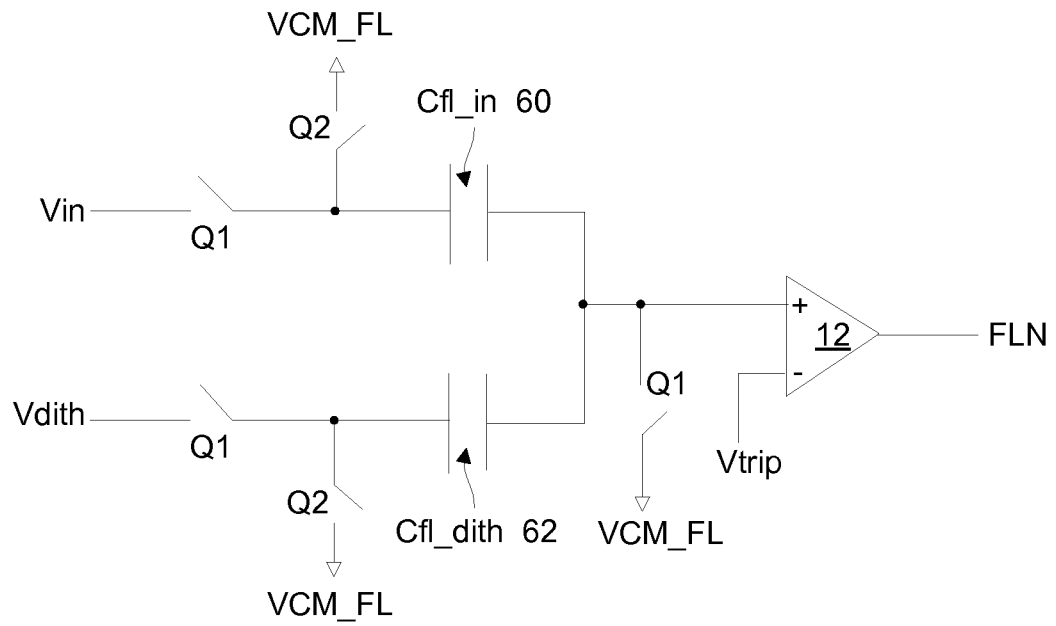
FIG. 8 shows an exemplary arrangement for injecting dither as an analog signal into the flash of FIG. 1.

FIG. 8 shows an example arrangement for injecting dither as an analog signal into the ADC 10. The arrangement includes a sampling capacitor Cfl_in 60 and a dither capacitor Cfl_dith 62. A first terminal of each capacitor 60/62 is switchably connected between the input Vin and a ground signal, e.g., Vss or a common mode voltage (VCM_FL), based on a pair of control signals Q1 and Q2. The control signals Q1/Q2 may be alternately pulsed so that when Cfl_in 60 is connected to Vin, Cfl_dith 62 is connected to a dither voltage Vdith, and so that both capacitors 60/62 are connected to VCM_FL simultaneously. The second terminals of the capacitors 60/62 are connected together and a combined signal representing the ADC 10 output plus injected dither is passed to a first input of the comparator 12 in response to Q1. The second input of the comparator 12 is connected to as a reference voltage Vtrip, which represents a tripping point for each comparator 12. For example, referring back to FIG. 2, the tripping point of the topmost capacitor 12 is 7/16*VFS. Vdith can be any randomly determined voltage and is analogous to the additional voltage produced in the previous embodiments using the random number RN.

Figure 9:
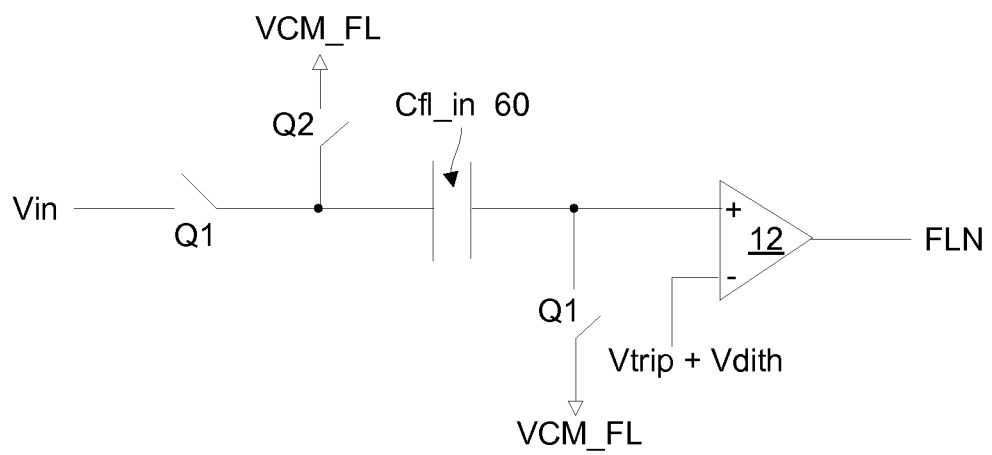
FIG. 9 shows another exemplary arrangement for injecting dither as an analog signal into the flash of FIG. 1.

FIG. 9 shows another example arrangement for injecting dither as an analog signal into the ADC 10. The arrangement of FIG. 9 includes Cfl_in 60 similar to FIG. 8. However, instead of injecting dither via Cfl_dith 62, dither can be injected by directly controlling the tripping point of the comparator 12, by superposing Vdith onto Vtrip.

Figure 10:
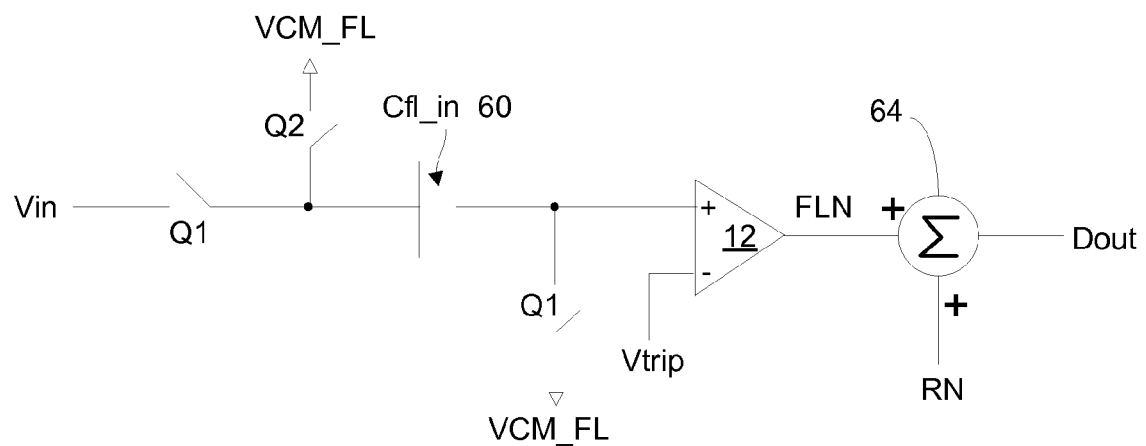
FIG. 10 shows another example arrangement for injecting dither as a digital signal into the flash of FIG. 1.

FIG. 10 shows an example arrangement for injecting dither as a digital signal into the ADC 10. As with the arrangements of FIGS. 8 and 9, the arrangement in FIG. 10 includes Cfl_in 60. However, dither is injected by combining a 1-bit RN with the 1-bit output of the comparator 12 at a summing node 64. The combining may be performed as an XOR operation, or another logical or arithmetic operation, e.g., binary addition. This may be performed at any one of the comparator 12 while leaving the remaining comparators 12 the same. It may also be applied to the combined ADC 10 output (FL0-FL7) as, for example, a 1-bit RN.

Figure 11:
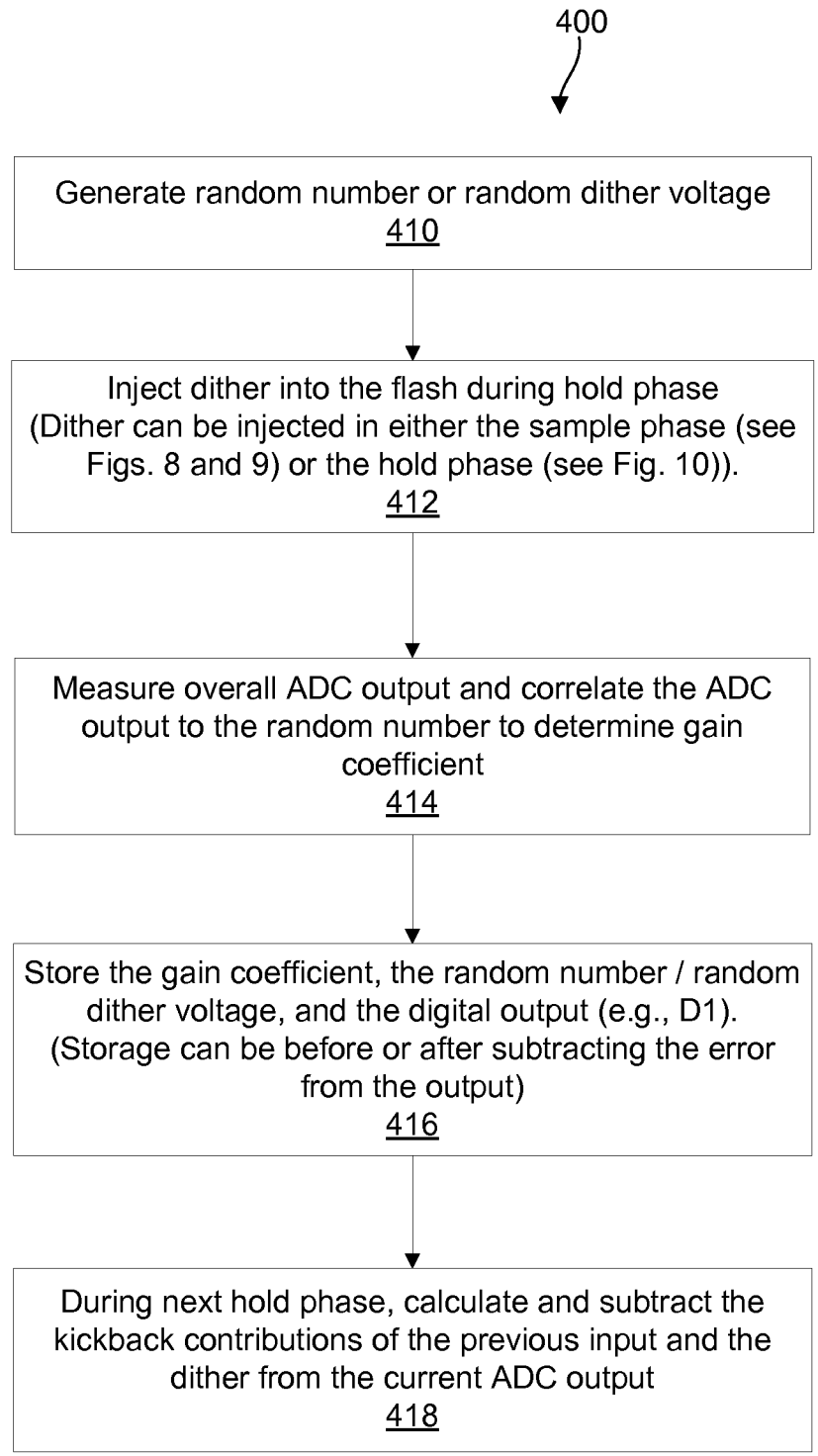
FIG. 11 shows another exemplary method for kick-back reduction using dither injection into the flash of FIG. 1.

FIG. 11 shows an example method 400 for reducing kick-back according to the present invention. The method 400 may be used in conjunction with any of the arrangements of FIGS. 8 through 10.

In step 410, the random number RN and the corresponding random dither voltage Vdith may be generated. As would be understood by one of ordinary skill in the art, Vdith is simply an analog representation of the digital RN. For example RN and Vdith may be related by a constant such that when Rn=1, Vdith=Vref/16 and when RN=0, Vdith=−Vref/16.

In step 412, which corresponds to a hold phase, the dither is injected into either the input or the output of the ADC 10.

In step 414, the overall ADC output is measured and correlated to (appropriately delayed) RN to generate the gain coefficient GC. Step 414 may be similar to step 316 of the method 300, except that a constant may scale RN when calculating GC.

In 416, D1, RN and the gain coefficient GC are stored, e.g., in the memory 230.

In 418, which corresponds to a subsequent hold phase, the kick-back contribution resulting from the injected dither is calculated. The kick-back contribution is then subtracted from the ADC output by the correction circuit 260. Since the FL output of the ADC 10 controls the DAC capacitors 8C, KB2 can be calculated as $D1_{k-1}*GC_n(k,k-1)$. KB1 is the same as in FIGS. 5A/5B, except it may be scaled based on (Vdith/Vref) i.e., $(Vdith/Vref)*RN_{k-1}*GC_n-(k,k-1)$.

When used in conjunction with the arrangements of FIGS. 8, 9 and 10 the method 400 accomplishes the dither injection and corresponding kick-back reduction without a need for additional capacitors in the sampling network, e.g., CCal 50/55. This may be beneficial in situations where it is undesirable to load the input network with additional capacitance.

In the preceding specification, the present invention has been described with reference to specific example embodiments thereof. It will, however, be evident that various modifications and changes may be made thereunto without departing from the broader spirit and scope of the present invention as set forth in the claims that follow. The embodiments described herein may be presented combined with each other in various combinations. The specification and drawings are accordingly to be regarded in an illustrative rather than restrictive sense. Also, the dither injection schemes (i.e., dither injection in the DAC and dither injection in the flash) can be applied simultaneously, after necessary modifications in how the GC is calculated, as would be understood by one of ordinary skill in the art.

What is claimed is:

1. A method, comprising:
   injecting a randomly determined amount of dither into a circuit having a switched capacitor network that is switchably connected to an input signal;
   after injecting the dither, determining at least one correlation value indicating a degree of correlation between the injected dither and an output of the circuit; and
   reducing distortion caused by an amount of charge kicked back into the circuit when the switched capacitor network is reconnected to the input signal, wherein an amount of the reduction is calculated as a function of the at least one correlation value.

2. The method of claim 1, wherein the dither is injected as a function of a randomly generated digital number.

3. The method of claim 1, wherein the dither is injected by superposing a randomly generated voltage onto an existing voltage signal in the circuit.

4. The method of claim 1, wherein the amount of the reduction is calculated using two components: an amount of kick-back contributed by the input signal when the switched capacitor network was previously connected, and an amount of kick-back contributed by the dither itself.

5. The method of claim 1, wherein the at least one correlation value is a gain coefficient, which is stored together with the random number and a digital value (D1) indicative of the kick-back due to the switched capacitor network in a storage memory.

6. The method of claim 1, wherein the at least one correlation value includes a first order (linear) gain coefficient and at least one higher order (non-linear) gain coefficient.

7. The method of claim 1, wherein the at least one correlation value is determined using a least means square (LMS) algorithm.

8. The method of claim 1, further comprising:
   extrapolating a correlation value corresponding to a previous injection, based on at least two correlation values that correspond to subsequent injections; and
   calculating the amount of the reduction as a function of the extrapolated correlation value.

9. The method of claim 1, wherein the circuit is a multi-stage analog-to-digital converter (ADC) and the dither is injected into an ADC component (flash) located within a first stage of the multi-stage ADC.

10. The method of claim 1, wherein the circuit is a multi-stage analog-to-digital converter (ADC) and the dither is injected into a digital-to-analog (DAC) component located within a first stage of the multi-stage ADC.

11. The method of claim 1, wherein the circuit is a multi-stage analog-to-digital converter (ADC) and the dither is injected into an ADC component (flash) located within a first stage of the multi-stage ADC and into a digital-to-analog (DAC) component located within the first stage of the multi-stage ADC.

12. The method of claim 1, wherein the circuit is a multi-stage analog-to-digital converter (ADC) and the output of the circuit, to which the injected dither is correlated, is obtained from a digital data constructed from the outputs of stages 2 to N of the multi-stage ADC, where N is the total number of stages.

13. A device, comprising:
   a hardware arrangement that injects a randomly determined amount of dither into a first circuit having a switched capacitor network that is switchably connected to an input signal;
   a correlation circuit that, after the dither is injected, and during a time period in which the switched capacitor network is disconnected from the input signal, determines at least one correlation value indicating a degree of correlation between the injected dither and an output of the first circuit; and
   a correction circuit that reduces distortion caused by an amount of charge kicked back into the first circuit when the switched capacitor network is reconnected to the input signal, wherein an amount of the reduction is calculated as a function of the at least one correlation value.

14. The device of claim 13, wherein the dither is injected as a function of a randomly generated digital number.

15. The device of claim 13, wherein the dither is injected by superposing a randomly generated voltage onto an existing voltage signal in the first circuit.

16. The device of claim 13, wherein the amount of the reduction is calculated using two components: an amount of kick-back contributed by the input signal when the switched capacitor network was previously connected, and an amount of kick-back contributed by the dither itself.

17. The device of claim 13, wherein the at least one correlation value is a gain coefficient, which is stored together with the random number and a digital value (D1) indicative of the kick-back due to the switched capacitor network in a storage memory.

18. The device of claim 13, wherein the at least one correlation value includes a first order (linear) gain coefficient and at least one higher order (non-linear) gain coefficient.

19. The device of claim 13, wherein the at least one correlation value is determined using a least means square (LMS) algorithm.

20. The device of claim 13, wherein:
   a correlation value corresponding to a previous injection is extrapolated based on at least two correlation values that correspond to subsequent injections; and
   the amount of the reduction is calculated as a function of the extrapolated correlation value.

21. The device of claim 13, wherein the first circuit is a multi-stage analog-to-digital converter (ADC) and the dither is injected into an ADC component (flash) located within a first stage of the multi-stage ADC.

22. The device of claim 13, wherein the first circuit is a multi-stage analog-to-digital converter (ADC) and the dither is injected into a digital-to-analog (DAC) component located within a first stage of the multi-stage ADC.

23. The device of claim 13, wherein the first circuit is a multi-stage analog-to-digital converter (ADC) and the dither is injected into an ADC component (flash) located within a first stage of the multi-stage ADC and into a digital-to-analog (DAC) component located within the first stage of the multi-stage ADC.

24. The device of claim 13, wherein the first circuit is a multi-stage analog-to-digital converter (ADC) and the output of the first circuit, to which the injected dither is correlated, is obtained from a digital data constructed from the outputs of stages 2 to N of the multi-stage ADC, where N is the total number of stages.

* * * * *